United States Patent
Park et al.

(10) Patent No.: US 9,425,111 B2
(45) Date of Patent: Aug. 23, 2016

(54) SEMICONDUCTOR PACKAGE

(71) Applicant: Samsung Electronics Co., Ltd., Suwon-si (KR)

(72) Inventors: Jin-Woo Park, Seoul (KR); Ji Hwang Kim, Chungcheongnam-do (KR); Jongbo Shim, Chungcheongnam-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/751,626

(22) Filed: Jun. 26, 2015

(65) Prior Publication Data

US 2016/0163608 A1     Jun. 9, 2016

(30) Foreign Application Priority Data

Dec. 8, 2014 (KR) .................. 10-2014-0175040

(51) Int. Cl.
*H01L 23/48* (2006.01)
*H01L 21/66* (2006.01)
*H01L 23/31* (2006.01)
*H01L 23/498* (2006.01)

(52) U.S. Cl.
CPC ............ *H01L 22/32* (2013.01); *H01L 23/3107* (2013.01); *H01L 23/3142* (2013.01); *H01L 23/49816* (2013.01); *H01L 23/49827* (2013.01)

(58) Field of Classification Search
CPC .............. H01L 2924/15311; H01L 25/0657; H01L 2224/16145; H01L 2224/0401; H01L 2225/1058
USPC .......... 257/666, 777, 778, 780, 781, 786, 784
See application file for complete search history.

(56) References Cited

U.S. PATENT DOCUMENTS

| | | | |
|---|---|---|---|
| 6,800,930 B2 | 10/2004 | Jackson et al. | |
| 7,026,234 B2 | 4/2006 | Jao et al. | |
| 7,112,883 B2 | 9/2006 | Hasunuma | |
| 7,355,273 B2 | 4/2008 | Jackson et al. | |
| 7,400,134 B2 * | 7/2008 | Morishita | G01R 31/31701 257/48 |
| 7,855,136 B2 | 12/2010 | Takahira | |
| 8,008,195 B2 | 8/2011 | Koike et al. | |
| 8,067,950 B2 | 11/2011 | Nagai et al. | |
| 8,183,579 B2 | 5/2012 | Wang | |
| 8,609,540 B2 | 12/2013 | Uzoh et al. | |
| 8,664,540 B2 | 3/2014 | Lu et al. | |
| 8,710,657 B2 | 4/2014 | Park et al. | |
| 8,829,680 B2 | 9/2014 | Uzoh et al. | |

(Continued)

FOREIGN PATENT DOCUMENTS

| JP | 2010-129959 A | * | 6/2010 |
|---|---|---|---|
| JP | 2010129959 | | 6/2010 |

(Continued)

*Primary Examiner* — S. V. Clark
(74) *Attorney, Agent, or Firm* — Onello & Mello, LLP

(57) ABSTRACT

A semiconductor package includes a package substrate; a semiconductor chip mounted on a top surface of the package substrate; a chip pad disposed on a bottom surface of the semiconductor chip to face the top surface of the package substrate, the chip pad including a connection pad and a measurement pad; and a chip bump including a first bump provided between the package substrate and the connection pad and a second bump provided between the package substrate and the measurement pad. An interconnection disposed within the package substrate is not connected to the second bump to be electrically isolated from the second bump.

20 Claims, 7 Drawing Sheets

(56) References Cited

U.S. PATENT DOCUMENTS

| | | | |
|---|---|---|---|
| 2004/0173794 A1* | 9/2004 | Yu | H01L 22/22 257/48 |
| 2010/0148812 A1* | 6/2010 | Nagai | H01L 22/32 324/762.06 |
| 2012/0139109 A1 | 6/2012 | Choi | |
| 2012/0261662 A1* | 10/2012 | Liang | H01L 22/34 257/48 |
| 2013/0043583 A1 | 2/2013 | Wu et al. | |
| 2013/0140688 A1 | 6/2013 | Chen et al. | |
| 2013/0221354 A1* | 8/2013 | Schieck | G01R 31/2884 257/48 |
| 2013/0221493 A1 | 8/2013 | Kim et al. | |
| 2013/0313690 A1 | 11/2013 | Miyazaki | |
| 2014/0151700 A1* | 6/2014 | Meyer | H01L 22/32 257/48 |
| 2014/0183758 A1 | 7/2014 | Nakamura et al. | |
| 2014/0239478 A1 | 8/2014 | Hong et al. | |

FOREIGN PATENT DOCUMENTS

| | | | |
|---|---|---|---|
| JP | 2012-146882 A | * | 8/2012 |
| JP | 2012146882 | | 8/2012 |
| KR | 10-2004-00063 A | * | 1/2004 |
| KR | 20040006383 | | 1/2004 |
| KR | 20120035721 | | 4/2012 |
| KR | 20140106038 | | 9/2014 |

* cited by examiner

SEMICONDUCTOR PACKAGE

CROSS-REFERENCE TO RELATED APPLICATIONS

This US non-provisional patent application claims priority under 35 USC §119 to Korean Patent Application No, 10-2014-0175040, filed on Dec. 8, 2014, the entirety of which is hereby incorporated by reference.

BACKGROUND

Embodiments of the present inventive concepts relate generally to semiconductor packages and, more particularly, to a semiconductor package including a test pad.

As stacked packages manufactured using a conventional wire bonding technique require high-performance characteristics, developments have been conducted on three-dimensional packages to which a through-silicon-via (TSV) technique is applied. A three-dimensional package includes components having various functions that are vertically stacked and may achieve extension of memory capacity, low power consumption, high transmission rate, and high efficiency.

A semiconductor package includes a test pad through which various tests are performed to check reliability of manufactured products.

SUMMARY

The present disclosure provides semiconductor packages with improved reliability.

A semiconductor package according to an embodiment of the inventive concepts may include a package substrate; a semiconductor chip mounted on a top surface of the package substrate; a chip pad disposed on a bottom surface of the semiconductor chip to face the top surface of the package substrate, the chip pad including a connection pad and a measurement pad; and a chip bump including a first bump provided between the package substrate and the connection pad and a second bump provided between the package substrate and the measurement pad. An interconnection disposed within the package substrate may not be connected to the second bump to be electrically isolated from the second bump.

In an example embodiment, the semiconductor package may further include a substrate pad disposed on the top surface of the package substrate. The interconnection may not be connected to the substrate pad at a position corresponding to the second bump.

In an example embodiment, the second bump may be in physical contact with the substrate pad.

In an example embodiment, height of the second bump may be smaller than that of the first bump.

In an example embodiment, the second bump may be spaced apart from the substrate pad and the first bump may be in contact with the substrate pad.

In an example embodiment, the second bump may be in contact with the top surface of the package substrate. The substrate pad may not be disposed on the top surface of the package substrate that is in contact with the second bump.

In an example embodiment, the measurement pad may be applied with a positive voltage and/or a voltage of 3.0 volts or above to 10.0 volts or less.

In an example embodiment, the interconnection may be disposed to the substrate pad corresponding to the first bump to be electrically connected the first bump.

In an example embodiment, the semiconductor package may further include an external terminal disposed on a bottom surface of the package substrate. The interconnection may connect the substrate pad and the external terminal to each other.

In an example embodiment, the second bump may further comprise a connection pillar and a solder that are in direct contact with the measurement pad. The measurement pad may have greater ionization tendency than the connection pillar and the solder, and the solder may have greater ionization tendency than the connection pillar.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION

Figure 1:
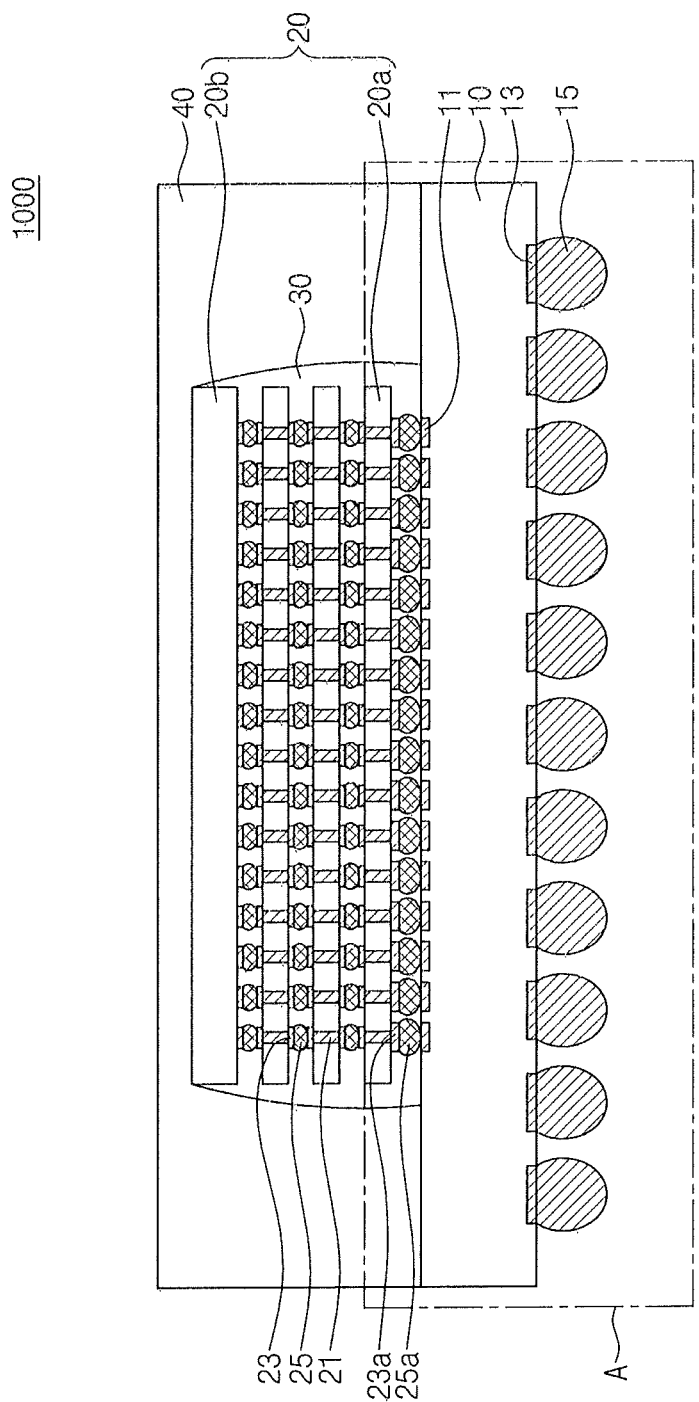
FIG. 1 is a cross-sectional view illustrating a semiconductor package according to first to fourth embodiments of the inventive concepts.

The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

In the specification, it will be understood that when an element is referred to as being "on" another layer or substrate, it can be directly on the other element, or intervening elements may also be present. In the drawings, thicknesses of elements are exaggerated for clarity of illustration.

Exemplary embodiments of the inventive concepts will be described below with reference to cross-sectional views, which are exemplary drawings of the inventive concepts. The exemplary drawings may be modified by manufacturing techniques and/or tolerances. Accordingly, the exemplary embodiments of the invention are not limited to specific configurations shown in the drawings, and include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the inventive concepts. Though terms like a first, a second, and a third are used to describe various elements in various embodiments of the inventive concepts, the elements are not limited to these terms. These terms are used only to tell one element from another element. An embodiment described and exemplified herein includes a complementary embodiment thereof.

The terms used in the specification are for the purpose of describing particular embodiments only and are not intended to be limiting of the inventive concepts. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

Hereinafter, embodiments of the inventive concepts will now be described more fully with reference to accompanying drawings.

Figure 2:
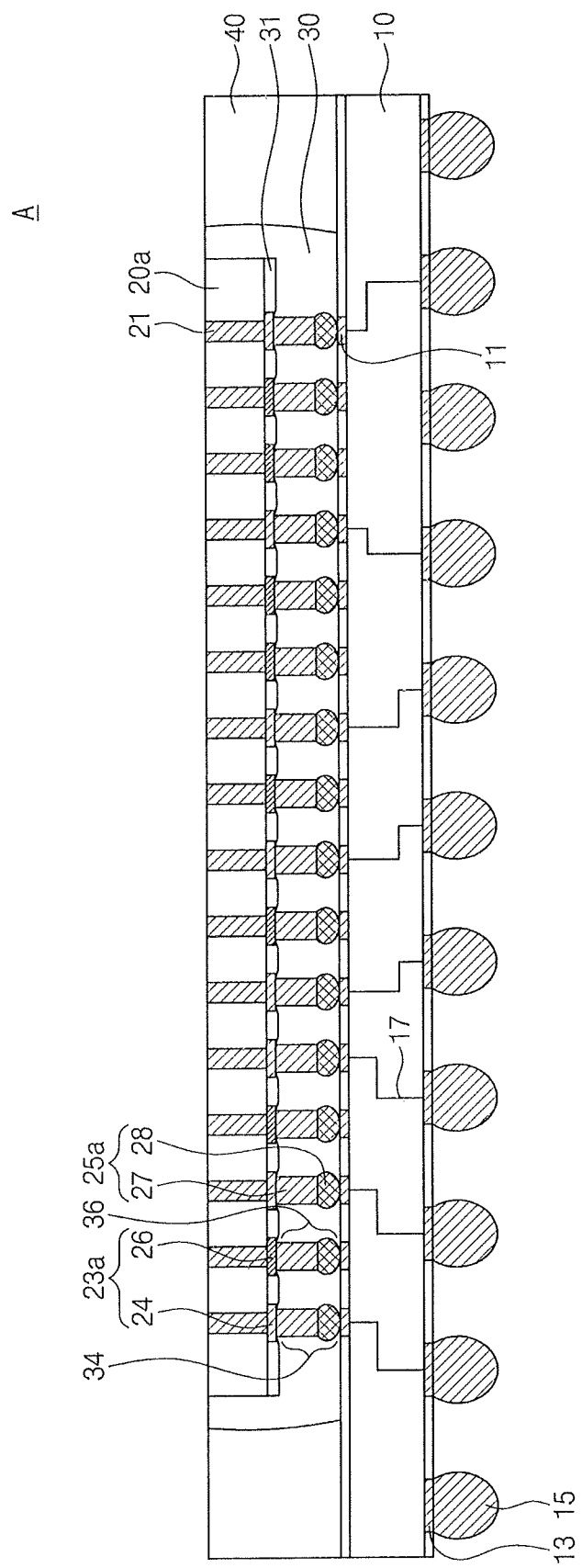
FIG. 2 is an enlarged cross-sectional view of a portion A in FIG. 1, illustrating a semiconductor package according to the first embodiment of the inventive concepts.

FIG. 1 is a cross-sectional view illustrating a semiconductor package according to first to fourth embodiments of the inventive concepts. FIG. 2 is an enlarged cross-sectional view of a portion A in FIG. 1, illustrating a semiconductor package according to the first embodiment of the inventive concepts.

Referring to FIGS. 1 and 2, the semiconductor package 1000 may include a package substrate 10, semiconductor chips 20 stacked on the package substrate 10, and a molding layer 40 to cover the semiconductor chips 20 on the package substrate 10.

A first substrate pad 11 may be disposed on a top surface of the package substrate 10, and a second substrate pad 13 may be disposed on a bottom surface of the package substrate 10. An external terminal 15 may be attached onto the second substrate pad 13. The external terminal 15 may be connected to an external device to electrically connect the semiconductor package 1000 and the external device to each other. The package substrate 10 may comprise a printed circuit board (PCB) having a multi-layered structure. The package substrate 10 may include a plurality of insulating layers (not shown) and interconnections 17 (see FIG. 2) disposed between the insulating layers. The first substrate pad 11, the second substrate pad 13, the external terminal 15, and the interconnections 17 may be formed of a conductive material.

A plurality of semiconductor chips 20 may be stacked on the package substrate 10. Through vias 21 may be formed at the semiconductor chips 20 to penetrate the semiconductor chips 20, respectively. In some embodiments, the through via 21 may not be formed at an uppermost semiconductor chip 20b stacked on an uppermost portion of the semiconductor chip 20. A chip pad 23 may be disposed on a surface of the semiconductor chips 20 to be in contact with the through via 21. A chip bump 25 may be disposed between chip pads 23 vertically facing each other.

The semiconductor chips 20 may include a first semiconductor chip 20a disposed at a lowermost portion of the semiconductor chips 20 to be adjacent to the package substrate 10. The chip pad 23 may include a first chip pad 23a disposed on a lower surface of the first semiconductor chip 20a. The chip bump 25 may include a first chip bump 25a attached onto the first chip pad 23a. The chip pad 23 and the chip bump 25 may include a metal material. More specifically, the chip bump 25 may include a metal material with lower ionization tendency than the chip pad 23. For example, the chip pad 23 may comprise aluminum (Al) and the chip bump 25 may be tin (Sn). The higher the ionization tendency of a metal material is the higher the corrosion rate of the metal material.

An adhesive layer 30 may be provided on the package substrate 10. Specifically, the adhesive layer 30 may be locally disposed between the package substrate 10 and the first semiconductor chip 20a and between the semiconductor chips 20. The adhesive layer 30 may cover sidewalls of the semiconductor chips 20. The adhesive layer 30 may comprise, for example, a non-conductive film (NCF). A top surface of an uppermost semiconductor chip 20b of the semiconductor chips 20 may be exposed by the adhesive layer 30. A molding layer 40 may be disposed on the package substrate 10. The molding layer 40 may be formed to fully cover the top surface of the package substrate 10 and the semiconductor chips 20.

Referring to FIG. 2, a first chip bump 25a substantially attached onto the first chip pad 23a may include a connection pillar 27 having predetermined height and a solder 28. After the connection pillar 27 is plated on the first chip pad 23a by means of a photolithography process and a plating process, the solder 28 may be plated on the connection pillar 27. The connection pillar 27 may have smaller ionization tendency than the solder 28. The connection pillar 27 may be, for example, copper (Cu). The solder 28 may comprise, for example, tin (Sn).

A passivation layer 31 may be disposed on a bottom surface of the first semiconductor chip 20a. The passivation layer 31 may cover a portion of the bottom surface of the first semiconductor chip 20a which is exposed by the first chip pad 23a. The passivation layer 31 may include an insulating material.

The first chip pad 23a may include a connection pad 24 and a measurement pad 26. The first chip bump 25a may be attached onto the connection pad 24 and the measurement pad 26. Specifically, the first chip bump 25a may include a connection bump 34 attached onto the connection pad 24 and a measurement bump 36 attached onto the measurement pad 26. The connection pad 24 may be electrically connected to the package substrate 10 via the connection bump 34 to provide a voltage to the semiconductor chip 20 and transmit a signal to the external device via the semiconductor chip 20. The measurement pad 26 is a pad to inspect electrical characteristics of a semiconductor chip. A probe needle for a probe card may come in contact with the measurement pad 26 to inspect the electrical characteristics of the semiconductor chip. When the semiconductor chip 20 is applied with a bias, the measurement pad 26 may be applied with a voltage. For example, the measurement pad 26 may be applied with either one of a positive voltage and a negative voltage. In addition, the measurement pad 26 may be applied with either one of a low voltage (e.g., 0 volts or above to 3.0 volts or less) and a high voltage (e.g., 3.0 volts or above to 10.0 volts or less).

The first chip bump 25a attached onto the first chip pad 23a may be in physical contact with the first substrate pad 11 disposed on the package substrate 10. The connection bump 34 disposed on the connection pad 24 to be in contact with the first substrate pad 11 may be electrically connected to the external terminal 15 by an interconnection 17 disposed within the package substrate 10. The measurement bump 36 disposed on the measurement pad 26 to be in contact with the first substrate pad 11 may not be electrically connected to the external terminal 15. In other words, the interconnection 17 is not electrically connected to the first substrate pad 11 that is in contact with the measurement bump 36, allowing the measurement pad 26 to be electrically insulated from the interconnection 17.

Since a measurement pad used to inspect electrical characteristics of a semiconductor chip must be insulated from an external system, a bump may not be disposed on the measurement pad. A semiconductor package may include various impurity ions (e.g., $Na^+$, $Cl^-$, $S^-$, $F^-$, etc.). When a bias is applied to the semiconductor chip to perform electrical inspection, impurity ions may have an influence on a measurement pad applied with a voltage to corrode the measurement pad. As the measurement pad is corroded, the corrosion may transition to interconnections within the semiconductor chip to damage the measurement pad (e.g., Burnt-out). Thus, the interconnections within the semiconductor chip may also be damaged to reduce reliability of a semiconductor package.

According to embodiments of the inventive concepts, a bump may be formed on the measurement pad 26. The bump covers an exposed surface of the measurement pad 26 to prevent the corrosion of the surface of the measurement pad 26 which is vulnerable to corrosion. In addition, some surface of the measurement pad 26 exposed by the connection pillar 27 may be formed metal oxide (e.g., $Al_2O_3$) by combining with oxygen ions. It may be easier for impurity ions to corrode the solder 28 than to corrode the measurement pad 26 covered with metal oxide. Accordingly, as the solder 28 corrodes instead of the measurement pad 26, the measurement pad 26 may be prevented from corroding. Thus, the reliability of the semiconductor 1000 may be improved.

Figure 3:
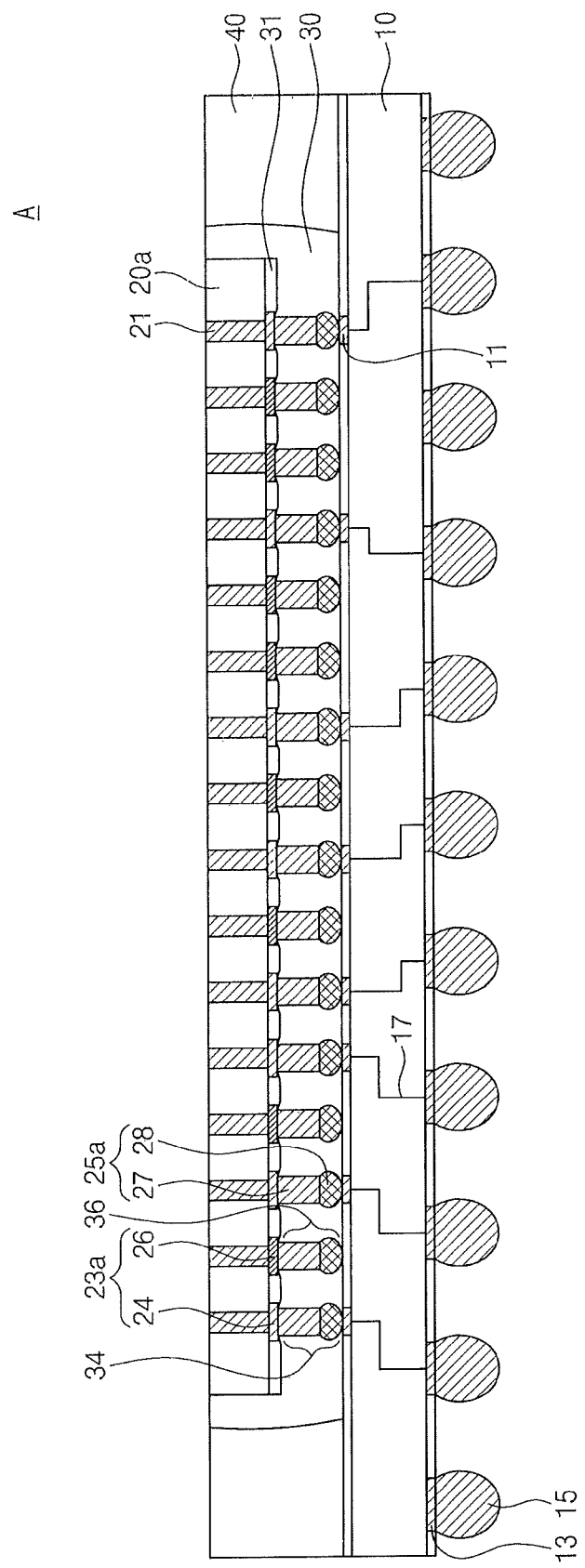
FIG. 3 is an enlarged cross-sectional view of a portion A in FIG. 1, illustrating a semiconductor package according to the second embodiment of the inventive concepts.

FIG. 3 is an enlarged cross-sectional view of a portion A in FIG. 1, illustrating a semiconductor package according to the second embodiment of the inventive concepts. For brevity of description, in FIG. 3, the components substantially identical with those of FIGS. 1 and 2 are designated by the same reference numerals and their explanations will be omitted.

Referring to FIG. 3, a first chip bump 25a may be attached onto a connection pad 24 and a measurement pad 26. The first chip bump 25a may include a connection bump 34 and a measurement bump 36. The connection bump 34 may be attached onto the connection pad 24, and the measurement bump 36 may be attached onto the measurement pad 26. The connection bump 34 may be in contact with a first substrate pad 11 disposed on a package substrate 10, while the measurement bump 36 may not be in contact with the first substrate pad 11. Specifically, the measurement bump 36 may be in contact with a top surface of the package substrate 10. However, the first substrate pad 11 may not be disposed on a top surface of the package substrate 10 that is in contact with the measurement bump 36.

An interconnection 17 disposed within the package substrate 10 may be connected to the first substrate pad 11 to electrically connect the first substrate pad 11 and the external terminal 15 to each other. Thus, the connection bump 34 in contact with the first substrate 11 may be electrically connected to the external terminal 15 by the interconnection 17. The first substrate pad 11 connected to the measurement pad 26 may be electrically connected to the external terminal 15 by the measurement bump 36.

Figure 4:
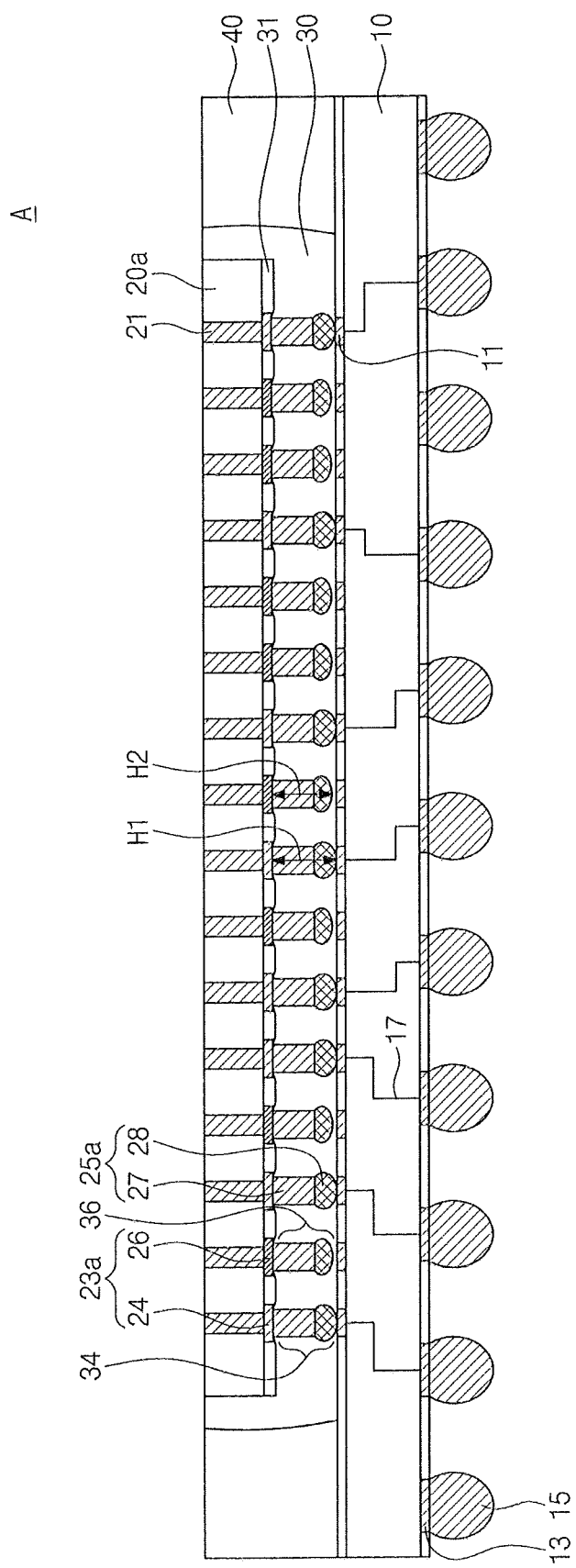
FIG. 4 is an enlarged cross-sectional view of a portion A in FIG. 1, illustrating a semiconductor package according to the third embodiment of the inventive concepts.

FIG. 4 is an enlarged cross-sectional view of a portion A in FIG. 1, illustrating a semiconductor package according to the third embodiment of the inventive concepts. For brevity of description, in FIG. 4, the components substantially identical with those of FIGS. 1 and 2 are designated by the same reference numerals and their explanations will be omitted.

Referring to FIG. 4, a first chip bump 25a may be attached onto the connection pad 24 and the measurement pad 26. The first chip bump 25a may include a connection bump 34 and a measurement bump 36. The connection bump 34 may be attached onto the connection pad 24, and the measurement bump 36 may be attached onto the measurement pad 26. The connection bump 34 may be in contact with a first substrate pad 11 disposed on a package substrate 10, while the measurement bump 36 may not be in contact with the first substrate pad 11. Specifically, the first substrate pad 11 may be disposed on a top surface of the package substrate 10 to correspond to the measurement bump 36. However, the measurement bump 36 may be attached onto the measurement pad 26 to be spaced apart from the first substrate pad 11. That is, height H2 of the measurement bump 36 may be smaller than height H1 of the connection bump 34. Accordingly, the measurement bump 36 disposed on the measurement pad 26 may be electrically insulated from an interconnection 17. The interconnection 17 disposed within the package substrate 10 may be connected to the first substrate pad 11 to electrically connect the first substrate pad 11 and an external terminal 15 to each other. Thus, the connection bump 34 may be electrically connected to the external terminal 15 by the interconnection 17.

Figure 5:
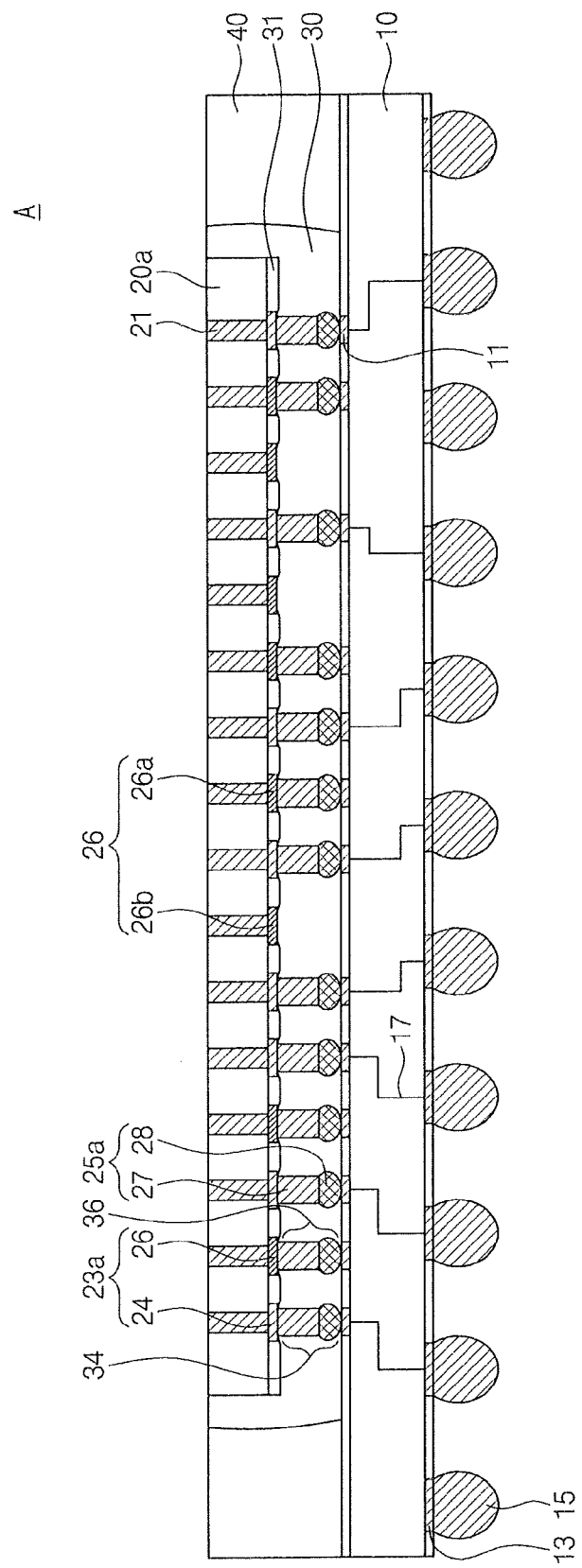
FIG. 5 is an enlarged cross-sectional view of a portion A in FIG. 1, illustrating a semiconductor package according to the fourth embodiment of the inventive concepts.

FIG. 5 is an enlarged cross-sectional view of a portion A in FIG. 1, illustrating a semiconductor package according to the fourth embodiment of the inventive concepts. For brevity of description, in FIG. 5, the components substantially identical with those of FIGS. 1 and 2 are designated by the same reference numerals and their explanations will be omitted.

Referring to FIG. 5, a connection bump 34 attached onto a connection pad 24 may be electrically connected to a first substrate pad 11. A measurement pad 26 may include a first measurement pad 26a and a second measurement pad 26b. A measurement pad 36 may be attached onto the first measurement pad 26a and may not be attached onto the second measurement pad 26b. In an example embodiment, the first measurement pad 26a may be applied with a positive voltage. When a first semiconductor chip 20a is applied with a bias, a connection pad 24 and the measurement pad 26 may be applied with either one of a negative voltage and a positive voltage. The first measurement pad 26a applied with the positive voltage may exhibit greater degree of corrosion than the second measurement pad 26b applied with the negative voltage. This is because ions to cause corrosion of the measurement pad 26 are $Cl^-$ and $F^-$ and cling to the first measurement pad 26a applied with the positive voltage.

In another example embodiment, the first measurement pad 26a may be applied with a high voltage. A corrosion rate of the first measurement pad 26a applied with a high voltage (e.g., 3.0 volts or above to 10.0 volts or less) may be higher than that of the second measurement pad 26b applied with a relatively lower voltage (e.g., 0 volt or above to 3.0 volts or less). Thus, a measurement bump 36 may be attached onto the first measurement pad 26a applied with the positive voltage and/or the first measurement voltage 26a applied with the high voltage high, but may not be attached onto the second measurement pad 26b applied with the negative voltage and/or the second measurement pad 26b applied with the low voltage.

An interconnection 17 may be disposed at a first substrate pad 11 connected to the connection pad 24 by a connection bump 34. Thus, the connection bump 34 disposed on the connection pad 24 may be electrically connected to the interconnection 17. The interconnection 17 may not be disposed on a first substrate pad 11 that is in contact with a measurement bump 36 disposed on the first measurement pad 26a. Thus, the measurement bump 36 may be electrically insulated from the interconnection 17.

The first substrate pad 11 may not be disposed at a position corresponding to the second measurement pad 26b.

When a semiconductor chip is applied with a bias, one of the measurement pads 26 may be applied with a positive voltage and another pad 26 may be applied with a negative voltage. The measurement pad 26 applied with the positive voltage may exhibit greater degree of corrosion than the measurement pad 26 applied with the negative voltage. This is because ions included in a semiconductor package bond to a surface of the measurement pad 26 applied with the positive voltage to have an influence of corrosion thereon. In addition, the measurement pad 26 applied with the high voltage may exhibit a greater degree of corrosion than the measurement pad 26 applied with the low voltage.

According to embodiments of the inventive concepts, a bump may be selectively formed on the first measurement pad 26a applied with a positive voltage and/or the first measurement pad 26a applied with a high voltage. Due to the reason described in the first embodiment, the first measurement pad 26a is protected by the bump to prevent the first measurement pad 26a from corroding. Moreover, an area of the first measurement pad 26a applied with the positive voltage is made larger than that of the second measurement pad 26b applied with the negative voltage to prevent the first measurement pad 26a from corroding. A bump may be selectively formed on the first measurement pad 26a applied with the positive voltage to increase an area of the measurement pad 26a applied with the positive voltage. Thus, reliability of a semiconductor package 1000 may be improved.

Figure 6:
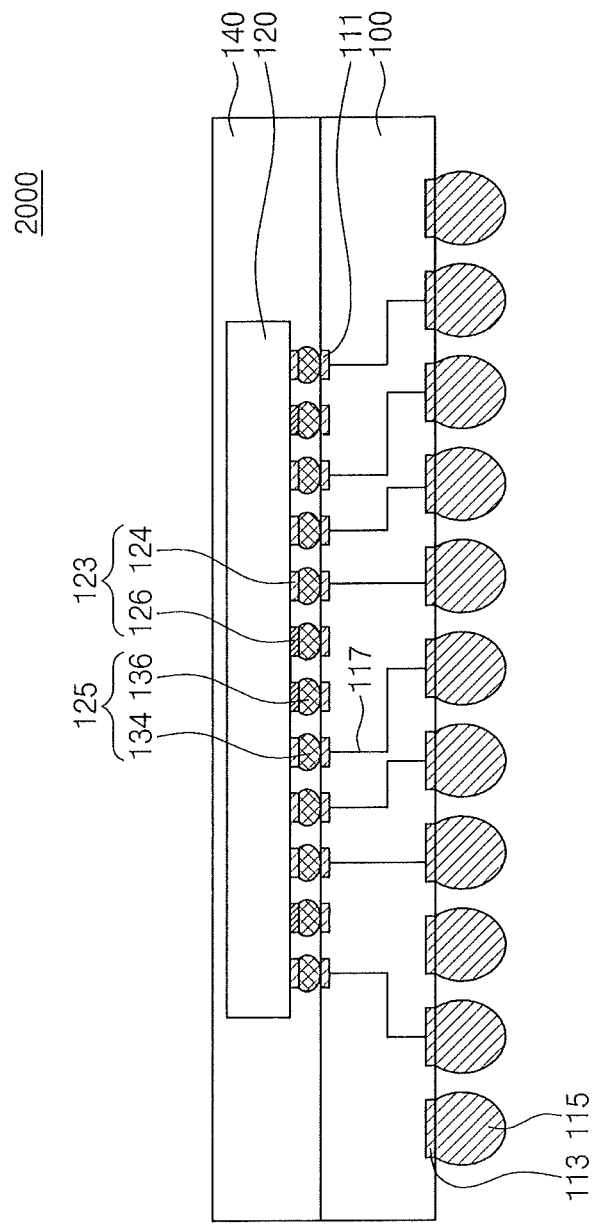
FIG. 6 is a cross-sectional view illustrating a semiconductor package according to a fifth embodiment of the inventive concepts.

FIG. 6 is a cross-sectional view illustrating a semiconductor package according to a fifth embodiment of the inventive concepts.

Referring to FIG. 6, the semiconductor package 2000 may include a package substrate 100, a semiconductor chip 120 stacked on the package substrate 100, and a molding layer 140 to cover the semiconductor chip 120 on the package substrate 100.

A first substrate pad 111 may be disposed on a top surface of the package substrate 100, and a second substrate pad 113 may be disposed on a bottom surface of the package substrate 100. An external terminal 115 may be attached onto the second substrate pad 113. The external terminal 115 may be connected to an external device to electrically connect the semiconductor package 2000 and the external device to each other. The package substrate 100 may be a printed circuit board (PCB) having a multi-layered structure. The package substrate 100 may include a plurality of insulating layers (not shown) and interconnection disposed between the insulating layers.

The semiconductor chip 120 may be mounted on the package substrate 100 in a flip-chip bonding manner. A chip pad 123 may be disposed on a bottom surface of the semiconductor chip 120, and a chip bump 125 may be attached onto the chip pad 123. The chip bump 125 formed on the bottom surface of the semiconductor chip 120 may be in contact with the first substrate pad 111 using flip-chip bonding.

The chip pad 123 may include a connection pad 124 and a measurement pad 126. The chip bump 125 may include a connection bump 134 and a measurement bump 136. The connection bump 134 may be attached onto the connection pad 124 and be in contact with the first substrate pad 111. A measurement bump 136 may be attached onto the measurement pad 126 and be in contact with the first substrate pad 111. An interconnection 117 may be disposed at the first substrate pad 111 connected to the connection pad 124 by the connection bump 134. Thus, the connection bump 134 disposed on the connection pad 124 may be electrically connected to the external terminal 115 via the interconnection 117 disposed within the package substrate 100. The interconnection 117 may not be disposed at the first substrate pad 111 that is in contact with the measurement bump 136 disposed on the measurement pad 126. Thus, the measurement bump 136 may be electrically insulated from the interconnection 117.

The chip pad 123 and the chip bump 125 may include a metal material. More specifically, the chip bump 125 may include a metal material with lower ionization tendency than the chip pad 123. For example, the chip pad 123 may be aluminum (Al) and the chip bump 125 may be tin (Sn). The higher the ionization tendency of a metal material, the higher the corrosion rate of the metal material. The measurement pad 126 may be applied with a positive voltage or a negative voltage. The measurement pad 126 may be applied with a lower voltage (e.g., 0 volt or above to 3.0 volts or less) or a high voltage (e.g., 3.0 volts or above to 10.0 volts or less). More specifically, the measurement pad 126 on which the measurement bump 136 is disposed may be applied with either one of a positive voltage and a high voltage. According to embodiments of the inventive concepts, the measurement bump 136 may be attached onto the measurement pad 126 to cover a surface of the measurement pad 126 and increase an area of the measurement pad 126. Thus, due to the reasons described in the first to the fifth embodiments, the measurement pad 126 may be prevented from corroding.

Figure 7:
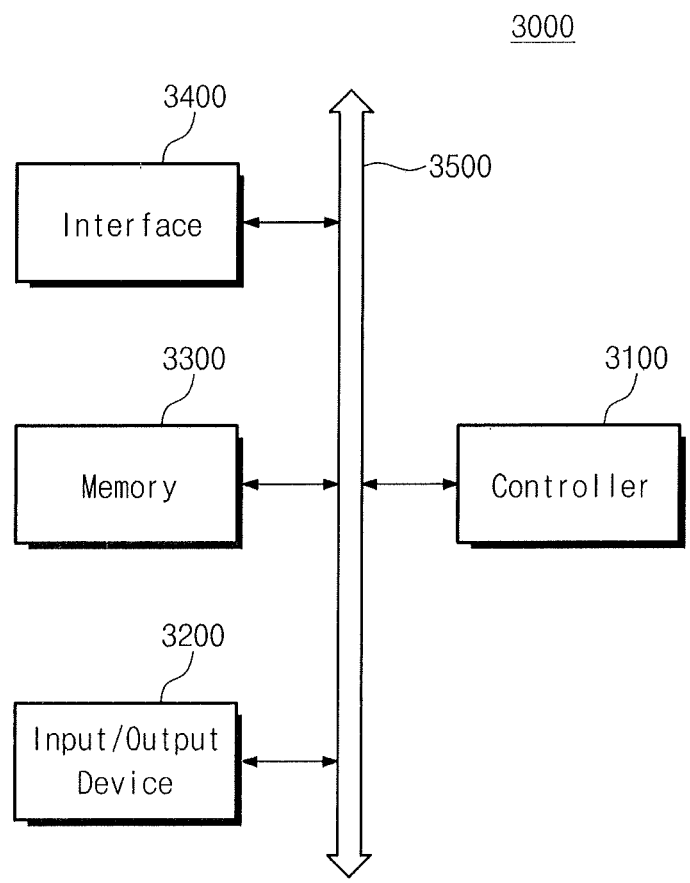
FIG. 7 is a block diagram illustrating an example of an electronic system including a semiconductor package according to embodiments of the inventive concepts.
Figure 8:
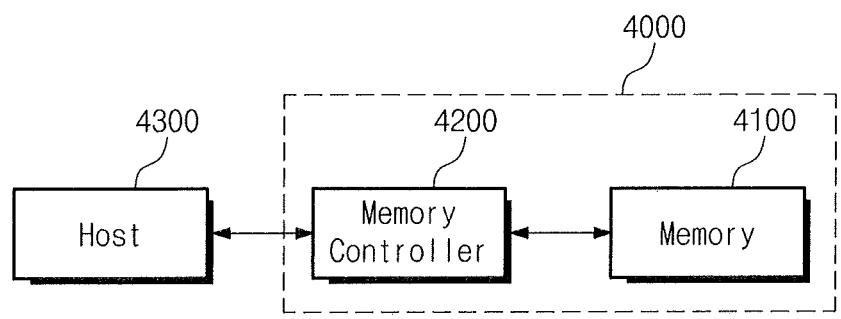
FIG. 8 is a block diagram illustrating an example of a memory card including a semiconductor package according to embodiments of the inventive concepts.

FIG. 7 is a block diagram illustrating an example of an electronic system 3000 including a semiconductor package according to embodiments of the inventive concepts, and FIG. 8 is a block diagram illustrating an example of a memory card 4000 including a semiconductor package according to embodiments of the inventive concepts.

As illustrated in FIG. 7, the electronic system 3000 may include a controller 3100, an input/output device 3200, and a memory device 3300. The controller 3100, the input/output device 3200, and the memory device 3300 may be connected to each other through the bus 3500. The bus 3500 may be a path along which data are transmitted. For example, the controller 3100 may include at least one of a microprocessor, a digital signal processor, a microcontroller or logic elements capable of performing the same functions as those of the above elements. The controller 3100 and the memory device 3300 may include a semiconductor package according to embodiments of the inventive concepts. The input/output device 3200 may include at least one of a keyboard, a keypad, and a display device. The memory device 3300 may store data and/or commands executed by the controller 3100. The memory device 3300 may be implemented using a flash memory. For example, a flash memory to which the present inventive concepts are applied may be mounted on an information processing system such as a mobile device or a desktop computer. The flash memory may include a solid state drive (SSD). In this case, the electronic system 3000 may stably store high-capacity data in the flash memory. The electronic system 3000 may further include an interface 3400 to transmit data to a communication network or receive data from the communication network. The interface 3400 may be in a wired or wireless form. For example, the interface 3400 may include an antenna, a wired/wireless transceiver or the like. Although not shown in the drawing, it will be apparent to those skilled in the art that that the electronic system 3000 may further include an application chipset, a camera image processor (CIS), and an input/output device.

The electronic system 3000 may be implemented as a mobile system, a personal computer, an industrial computer or a multi-functional logic system. For example, the mobile system may be one of a personal digital assistant (PDA), a portable computer, a web tablet, a mobile phone, a wireless phone, a laptop computer, a memory card, a digital music system or an information transmitting/receiving system. If the electronic system 3000 is an apparatus capable of performing wireless communication, the electronic system 3000 may be used in a communication interface protocol such as a third-generation communication system (e.g., CDMA, GSM, NADC, E-TDMA, WCDMA, CDMA2000, etc.).

As illustrated in FIG. 8, the memory card 4000 may include a nonvolatile memory device 4100 and a memory controller 4200. The nonvolatile memory device 4100 and the memory controller 4200 may store data or read stored data. The nonvolatile memory device 4100 may include a semiconductor package according to embodiments of the inventive concepts. The memory controller 4200 may control the nonvolatile memory device 4100 to read stored data or store data in response to read/write requests.

As described above, a semiconductor package according to embodiments of the inventive concepts includes a measurement pad onto which a measurement bump may be attached. Thus, corrosion of the measurement pad may be prevented to improve reliability of the semiconductor package.

While the present disclosure has been particularly shown and described with reference to exemplary embodiments thereof, the general inventive concepts is not limited to the above-described embodiments. It will be understood by those of ordinary skill in the art that various changes and variations in form and details may be made therein without departing from the spirit and scope of the inventive concepts as defined by the following claims.

What is claimed is:

1. A semiconductor package comprising:
a package substrate;
a semiconductor chip on a top surface of the package substrate;
a chip pad on a bottom surface of the semiconductor chip to face the top surface of the package substrate, the chip pad including a connection pad and a measurement pad; and
a chip bump including a first bump between the package substrate and the connection pad and a second bump between the package substrate and the measurement pad,
wherein an interconnection within the package substrate is not connected to the second bump to be electrically isolated from the second bump.

2. The semiconductor package of claim 1, further comprising:
a substrate pad on the top surface of the package substrate,
wherein the interconnection is not connected to the substrate pad at a position corresponding to the second bump.

3. The semiconductor package of claim 2, wherein the second bump is in physical contact with the substrate pad.

4. The semiconductor package of claim 2, wherein height of the second bump is smaller than that of the first bump.

5. The semiconductor package of claim 4, wherein the second bump is spaced apart from the substrate pad and the first bump is in contact with the substrate pad.

6. The semiconductor package of claim 1, further comprising a substrate pad on the top surface of the package substrate, wherein the second bump is in contact with the top surface of the package substrate and is spaced apart from the substrate pad.

7. The semiconductor package of claim 1, wherein the measurement pad is applied with a positive voltage and/or a voltage of 3.0 volts or above to 10.0 volts or less.

8. The semiconductor package as of claim 1, further comprising a substrate pad on the top surface of the package substrate,
wherein the interconnection is connected to the substrate pad corresponding to the first bump to be electrically connected to the first bump.

9. The semiconductor package of claim 8, further comprising:
an external terminal on a bottom surface of the package substrate,
wherein the interconnection connects the substrate pad and the external terminal to each other.

10. The semiconductor package of claim 1, wherein the second bump further comprises a connection pillar and a solder that are in direct contact with the measurement pad, and
wherein the measurement pad has greater ionization tendency than the connection pillar and the solder, and the solder has greater ionization tendency than the connection pillar.

11. The semiconductor package of claim 1, wherein the measurement pad is used to inspect electrical characteristics of the semiconductor chip.

12. The semiconductor package of claim 1, the chip bump includes a metal material with lower ionization tendency than the chip pad,
wherein a corrosion rate of the chip bump is lower than a corrosion rate of the chip pad.

13. The semiconductor package of claim 1, further comprising:
a through via penetrating the semiconductor chip to contact the chip pad;
an adhesive layer filling between the package substrate and the semiconductor chip; and
a molding layer covering the semiconductor chip on the package substrate.

14. The semiconductor package of claim 13, wherein the adhesive layer comprises a non-conductive film.

15. A semiconductor package comprising:
a package substrate;
a semiconductor chip mounted on a top surface of the package substrate;
chip pads disposed on a bottom surface of the semiconductor chip to face the top surface of the package substrate, the chip pads including connection pads and measurement pads; and
first bumps provided between the package substrate and the connection pads,
wherein second bumps are attached onto some of the measurement pads and are not attached onto others of the measurement pads.

16. The semiconductor package of claim 15, wherein a positive voltage is applied to the measurement pads onto which the second bumps are attached and a negative voltage is applied to the measurement pads onto which the second bumps are not attached.

17. The semiconductor package of claim 15, wherein a higher voltage is applied to the measurement pads onto which the second bumps are attached than to the measurement pads onto which the second bumps are not attached.

18. The semiconductor package of claim 15, wherein the second bumps are not connected to an interconnection disposed within the package substrate to be electrically insulated from the interconnection.

19. The semiconductor package of claim 18, wherein the first bumps are connected to the interconnection disposed within the package substrate to be electrically connected each other.

20. The semiconductor package of claim 15, further comprising substrate pads disposed on the top surface of the package substrate,
   wherein the substrate pads are at a position corresponding to the connection pads and the measurement pads.

\* \* \* \* \*